(12) United States Patent
Iwami et al.

(10) Patent No.: US 8,667,346 B2
(45) Date of Patent: Mar. 4, 2014

(54) SEMICONDUCTOR INTEGRATED CIRCUIT DEVICE, METHOD OF CONTROLLING THE SEMICONDUCTOR INTEGRATED CIRCUIT DEVICE AND INFORMATION PROCESSING SYSTEM

(71) Applicant: Fujitsu Limited, Kawasaki (JP)

(72) Inventors: Yoshikazu Iwami, Inagi (JP); Hideyuki Sakamaki, Yokohama (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/749,079

(22) Filed: Jan. 24, 2013

(65) Prior Publication Data

US 2013/0139016 A1   May 30, 2013

Related U.S. Application Data

(63) Continuation of application No. PCT/JP2010/062786, filed on Jul. 29, 2010.

(51) Int. Cl.
*G11C 29/00* (2006.01)

(52) U.S. Cl.
USPC ............................ 714/718; 714/724; 714/731

(58) Field of Classification Search
USPC .................. 714/718, 731, 724, 726, 733, 734
See application file for complete search history.

(56) References Cited

U.S. PATENT DOCUMENTS 5,627,841 A * 5/1997 Nakamura .................... 714/731
6,237,122 B1 * 5/2001 Maki ............................. 714/730
6,341,092 B1 * 1/2002 Agrawal ........................ 365/201
7,236,903 B2    6/2007 Goishi
7,716,545 B2 * 5/2010 Shimooka ..................... 714/726
7,913,138 B2 * 3/2011 Sawamura .................... 714/731
7,966,535 B2 * 6/2011 Agarwal ....................... 714/727
2005/0270038 A1  12/2005 Goishi
2006/0190786 A1 *  8/2006 Hidaka et al. ................. 714/726

FOREIGN PATENT DOCUMENTS

| JP | 2000-193722 | 7/2000 |
| JP | 2005-249736 | 9/2005 |
| JP | 2006-170963 | 6/2006 |
| JP | 2007-225514 | 9/2007 |
| JP | 2009-258857 | 11/2009 |

OTHER PUBLICATIONS

International Search Report of Corresponding PCT Application PCT/JP2010/062786 mailed Oct. 26, 2010.

* cited by examiner

*Primary Examiner* — Fritz Alphonse

(74) *Attorney, Agent, or Firm* — Staas & Halsey LLP

(57) ABSTRACT

A debug system scans a scan memory element group having a plurality of scan memory elements which are connected in series in a semiconductor integrated circuit device and collects data in the scan memory element group. The semiconductor integrated circuit device has an end code register which is provided between an input terminal and an input side of the scan memory element group and holds an end code, a start code register which is provided between an output terminal and an output side of the scan memory element group and holds a start code, and a scan control circuit which controls shift operations of the scan memory element group, the end code register and the start code register, and outputs scan data to the output terminal.

20 Claims, 15 Drawing Sheets

FIG.10

| input → output | si | Aso | Bso | Cso | Dso | Eso |
|---|---|---|---|---|---|---|
| Asi | ○ | | | | | |
| Bsi | ○ | ○ | | | | |
| Csi | ○ | ○ | ○ | | | |
| Dsi | ○ | ○ | ○ | ○ | | |
| Esi | ○ | ○ | ○ | ○ | ○ | |
| so | ○ | ○ | ○ | ○ | ○ | ○ |

FIG.11

| input → output | input | | | | | | |
|---|---|---|---|---|---|---|---|
| | si | Aso | Bso | Cso | Dso | Eso |
| Asi | N | | | | | |
| Bsi | B+a | N | | | | |
| Csi | C+a+b | b | N | | | |
| Dsi | D+a+b+c | b+c | c | N | | |
| Esi | E+a+b+c+d | b+c+d | c+d | d | | |
| so | N | A+b+c+d+e | B+c+d+e | C+d+e | D+e | N+E |

N: Normal (A-E_chain_sel all off state/ A-E_BYP_sel all off state)/uni_chain_sel:ON
A-E : ON bit of A-E_chain_sel
A-e : ON bit of A-E_BYP

SEMICONDUCTOR INTEGRATED CIRCUIT DEVICE, METHOD OF CONTROLLING THE SEMICONDUCTOR INTEGRATED CIRCUIT DEVICE AND INFORMATION PROCESSING SYSTEM

CROSS-REFERENCE TO RELATED APPLICATION

This application is a continuation application of International Application PCT/JP2010/062786 filed on Jul. 29, 2010 and designated the U.S., the entire contents of which are incorporated herein by reference.

FIELD

The embodiments discussed herein are related to a semiconductor integrated circuit device, a method of controlling the semiconductor integrated circuit device and an information processing system.

BACKGROUND

A semiconductor integrated circuit is equipped with a large number of circuit elements due to an improvement of degree of the integration of the semiconductor integrated circuit. In particular, the large-scale integrated circuit (LSI: Large Scale Integrated Circuit) is equipped with several hundred thousand or several million circuit elements. A functional test of the large-scale integrated circuit (hereinafter referred to as LSI) is effective in order to perform research, analysis and confirmation of the internal circuits.

A boundary scan test has been used as an operation test of the internal circuits in the LSI and a test of a board after mounting the LSI on a printed circuit board. A test method by the JTAG (Joint Test Action Group) of IEEE 1149.1 (IEEE: The Institute of Electrical and Electronic Engineers, Inc) standard is a representative example of the boundary scan test.

FIG. 14 is a block diagram of a scan test by the JTAG. FIG. 15 is a time chart of control signals in FIG. 14. As depicted by FIG. 14, a logic circuit 200 of the test target is configured of a plurality of flip-flop circuits 200-1~200-M. These flip-flop circuits (hereinafter referred to as FF) 200-1~200-M are connected in series (called to scan chain). And the FF is one type of cell, and has a shift register and a latch circuit, in general.

In the JTAG scan method, an exclusive path of the test is provided for the test logic circuit 200. Signal lines from the external device include TDI (Test Data In), TDO (Test Data Out), TCK (Test Clock), TMS (Test Mode Select), and TRST (Test Reset). The TDI is a signal which serial inputs a command and data to the test logic circuit 200 (200-1~200-M). The TDO is a signal which serial outputs data from the test logic circuit 200 (200-1~200-M).

The TCK provides clock to the test logic circuit 200 (200-1~200-M). The TMS is a signal for controlling the test operation. The TRST is a signal for asynchronously initializing a TAP (Test Access Port) controller 210 (as described later).

The TAP controller 210 is a state machine which performs to capture, to shift, and to update, as a major operation. The TAP controller 210 receives a start of a designation of a mode via the TMS signal line. And the TAP controller 210 sets a mode instruction from the TDI into an instruction register (not indicated by FIG. 14).

The TAP controller 210 supplies shift clocks "dack" and "dbck" as illustrated in FIG. 15 to each of the FF 200-1~200-M. By the shift clocks "dack" and "dbck", each of the FF 200-1~200-M performs to fetch data into the shift register, to output the contents of the shift register, and to fix to the latch circuit.

The TAP controller 210 performs the scan test by supplying the shift clocks "dack" and "dbck" to the FF 200-1~200-M, sequentially shifting the data to FF 200-2~200-M of the next stage, and outputting the data from the TDO signal line.

On the other hand, as the test method of the semiconductor integrated circuit itself, a test device inputs a serial test pattern to the logic circuit which is configured of a multi-stage flip flop circuits, fetches the output of the logic circuit, and determines whether or not the output is the inputted test pattern. This method is effective as a test method whether or not the operation of each FF itself in the logic circuit is normal, prior to a shipment of the semiconductor integrated circuit.

RELATED ART

Japanese Laid-Open Patent Publication No. 2006-170963
Japanese Laid-Open Patent Publication No. 2007-225514

The boundary scan test is effective in the operation test of the internal circuits in the LSI and the board test after mounting the LSI on the printed circuit board, and has been used in a debug which is a functional test of the LSI. The debug performs to research, to analyze and to confirm the internal circuitry after the functional test was executed. Therefore, it is effective to fetch the data that is held by the FF 200-1~200-M.

Since the scan test has been simply fetched the data which holds the FF 200-1~200-M, it is difficult to analyze the data held in the hundred thousands of circuit elements. For example, in the initial stage of the LSI functional testing, it is necessary to determine correct or incorrect whether the scan was successful, or whether or not the acquired data is correct. The identification of the correct and incorrect requires a long-term effort. For example, when there is a disconnection between the FF or a failure of the operation of the FF in only one FF, there is a need for long-term analysis to determine the fault location from the acquired data.

In addition, in the method of inputting the serial test pattern to the logic circuit from the test device, since the data that holds the FF200-1~200-M are ignored, it is difficult to judge the correctness of the data in the LSI.

SUMMARY

According to an aspect of the embodiments, a semiconductor integrated circuit device includes a scan memory device group that a plurality of scan memory elements are connected in series, a first register that is provided between an input terminal and a input side of the scan memory device group and holds an end code, a second register that is provided between an output terminal and an output side of the scan memory device group and holds a start code, and a scan control circuit that performs a shift operation of the scan memory device group, the first register and the second register and outputs scan data to the output terminal.

Further, according to another aspect of the embodiments, a method of controlling the semiconductor integrated circuit device, which performs a shift operation of the scan memory device group that a plurality of scan memory elements are connected in series and collects data in the scan memory device group, includes shifting data in the first register that is provided between an input terminal and a input side of the scan memory device group and holds an end code, a second register that is provided between an output terminal and an output side of the scan memory device group and holds a start code, and the scan memory device group, and outputting the scan data to the output terminal.

In addition, according to the other aspect of the embodiments, an information processing system includes a processing device having a semiconductor integrated circuit that executes information processing, and a system controller that monitors the processing apparatus, and the semiconductor integrated circuit includes a functional circuit that executes the information processing, a scan memory device group that a plurality of scan memory elements are connected in series, a first register that is provided between an input terminal connected to the system controller and a input side of the scan memory device group and holds an end code, a second register that is provided between an output terminal connected to the system controller and an output side of the scan memory device group and holds a start code, and a scan control circuit that performs a shift operation of the scan memory device group, the first register and the second register and outputs scan data to the output terminal.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 10 is an explanatory diagram of selection logic of the selection circuit in FIG. 9;

FIG. 11 is an explanatory diagram of the selection condition of the selection circuit in FIG. 10;

DESCRIPTION OF EMBODIMENTS

Hereinafter, the embodiments will be described in the order of a debug system, a semiconductor integrated circuit device, a control method of a semiconductor integrated circuit device, a method of specifying for fault location, an information processing apparatus, and the other embodiments, but the semiconductor integrated circuit device and the information processing apparatus are not limited to this embodiment.

(Debug System)

Figure 1:
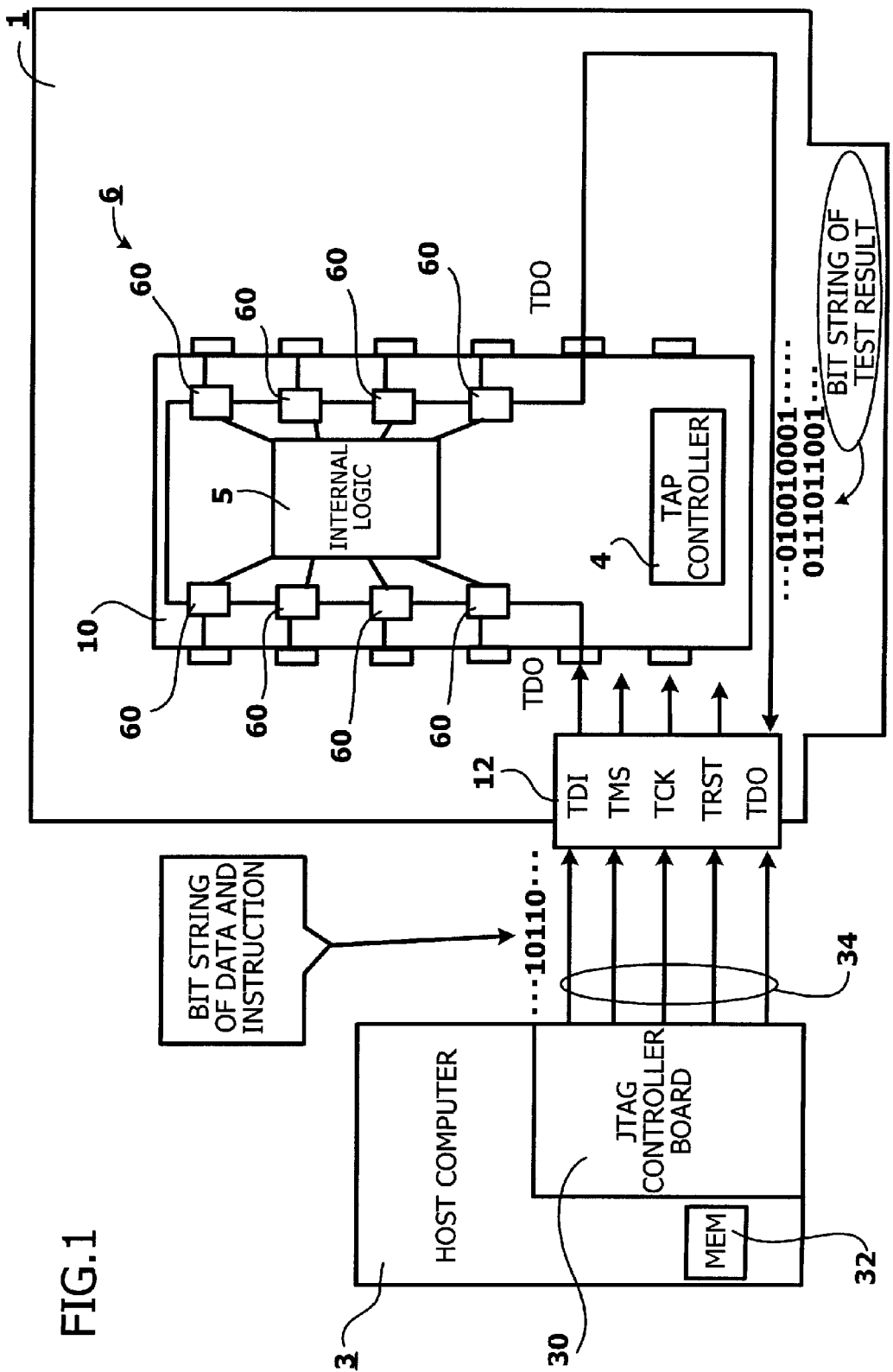
FIG. 1 is a block diagram of a debug system according to an embodiment.

FIG. 1 is a block diagram of a debug system according to the embodiment. Below, the debug system is described an example of the JTAG standard system. As illustrated in FIG. 1, a circuit board (hereinafter referred to as board) 1 mounts the semiconductor integrated circuit device (hereinafter referred to as LSI) 10 being debugged and a JTAG connector 12. The JTAG connector 12 of the board 1 connects to a JTAG controller board 30 which is provided to a host computer 3 through an exclusive cable (signal line) 34.

The LSI 10 includes internal logic circuits 5, a scan memory element group 6 and the TAP controller 4. The scan memory element group 6 has a plurality of scan memory elements 60 which is daisy chain connected. The internal logic circuitry 5 consists of logic circuitry to perform a variety of functions, and for example, the internal logic circuit 5 is an arithmetic processing unit and a memory controller. The scan memory element 60 is consisted of a memory element to hold the data of each part of the internal logic circuit 5, and for example, the scan memory element 60 is consisted of a flip-flop circuit having a shift register and a latch circuit.

The exclusive cable 34 has respective signal lines of the TDI (Test Data In), the TDO (Test Data Out), the TCK (Test Clock), the TMS (Test Mode Select), and the TRST (Test Reset). The TDI is an input signal line which serial inputs a command and data to the scan memory element (as referred to FF) 60. The TDO is an output signal line which serial outputs data from the FF 60.

The TCK signal line provides clock to the TAP controller 4. The TMS signal line is a signal line for controlling the test operation of the TAP controller 4. The TRST signal line is a signal line for asynchronously initializing the TAP controller 4. The TAP controller 4 is a state machine which performs to capture, to shift, and to update, as a major operation.

The host computer 3 includes an arithmetic processing device (not indicted in FIG. 1), a JTAG controller board 30 and a memory 32. The JTAG controller board 30 is equipped with a JTAG controller. The JTAG controller controls the input and output of serial data to and from the connector 12 and controls the TMS signal and the TCK signal via the cable 34.

In this way, in a state where the LSI 10 is mounted on the board 1, the host computer 3 performs functional testing of the LSI 10. In an early stage of this functional test, it is performed to scan the FF 60 in the LSI 10 and to collect data in the FF 60. The collected data is stored in the memory 32 of the host computer 3. The collected data in the memory 32 is outputted and then utilized for determining the correctness of the collected data and the fault location.

(Semiconductor Integrated Circuit Device)

Figure 2:
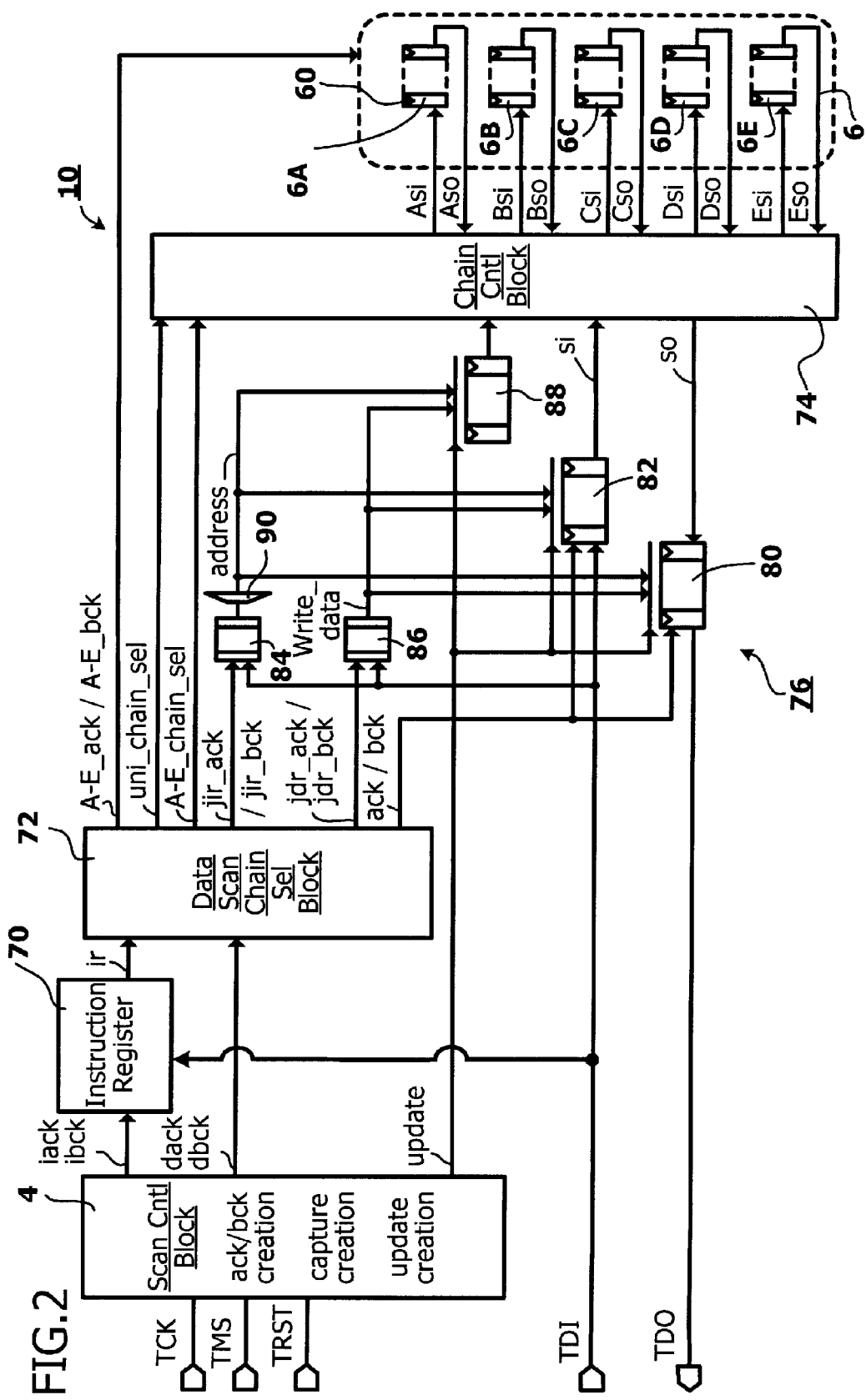
FIG. 2 is a block diagram of a semiconductor integrated circuit device in a configuration of FIG. 1.

FIG. 2 is a block diagram of the TAP controller 4, the scan memory element group 6 and the control circuit in FIG. 1.

In FIG. 2, same elements as that depicted by FIG. 1 are indicated by the same symbols. As illustrated by FIG. 2, an instruction register 70, a data scan chain selection circuit (data scan chain selection block) 72, a chain control circuit (chain control block) 74 and a data setting circuit 76 are provided between the TAP controller 4 (as described by Scan Cntl Block in FIG. 2) and the scan memory element group 6.

The instruction register 70 is consisted of a shift register, and stores an instruction (for example, mode instruction) from the TDI signal line. The data scan chain selection circuit 72 instructs an uni chain or user chain by using the signal of "uni_chain_sel" and the signal of "A-E_chain_sel" depending on the instruction in the instruction register 70.

The scan memory element group 6 is divided into a plurality of blocks 6A, 6B, 6C, 6D and 6E. Each of the blocks 6A, 6B, 6C, 6D and 6E has a plurality of the FF 60 which is chain connected. Each of blocks 6A, 6B, 6C, 6D and 6E is connected to the chain control circuit 74, and receives the inputs Asi, Bsi, Csi, Dsi, and Esi from the chain control circuit 74 and outputs the outputs Aso, Bso, Cso, Dso, and Eso to the chain control circuit 74.

When the uni-chain is instructed from the data scan chain selection circuit (Data Scan Chain Select Block) 72, the chain selection circuit 74 connects all of each blocks 6A, 6B, 6C, 6D and 6E and shifts data of the FF 60 in each block. When the user chain is instructed, the chain selection circuit 74 shifts the data in each FF60 for each block 6A, 6B, 6C, 6D and 6E. The uni-chain means a single chain which is connected all user chain (each block).

In addition, the data setting circuit 76 includes a start code register 80, an end code register 82, a bypass setting register 88, a data register 86, an address code register 84 and an address decoder 90. Each of the start code register 80, the end code register 82, the bypass setting register 88, the data register 86 and the address register 84 is constituted by a shift register.

The start code register 80, which holds the start code, is provided between the chain control circuit 74 and the output signal line TDO. The end code register 82, which holds the end code, is provided between the chain control circuit 74 and the input signal line TDI. The bypass setting register 88 hold the data that specifies the block (chain) to be bypassed and is connected to the chain control circuit 74.

The data register 86 holds data (the start code, the end code, the bypass setting data) from the input signal line TD1, and writes the data into each of the start code register 80, the end code register 82 and the bypass setting register 88. The address register 84 holds the address (start code register address, end code register address, bypass setting data register address) from the input signal line TD1. The address decoder 90 decodes the address in the address register 84, and outputs write instructions to each of the start code register 80, the end code register 82 and the bypass setting register 88.

With this configuration, when scanning, the start code in the start code register 80 is firstly outputted to the output signal line TDO (called to shift-out). In addition, when scanning, the end code in the end code register 82 is shifted out to the signal line TDO at the end. The chain control circuit 74 bypasses the chain (block) that the bypass setting data is set to "1" in the bypass setting register 88. Further, the data register 86 and the address register 84 are registers that can be accessed only during a scan.

(Control Method of a Semiconductor Integrated Circuit Device)

The setting operation of the data to the start code register 80, the end code register 82 and the bypass setting register 88 will be described by using FIG. 2. First, The TAP controller 4 sets the code of selection of the address register in the instruction register 70. In other words, the TAP controller 4 receives the mode instruction from the signal line TMS, and supplies the shift clocks "iack" and "ibck" to the instruction register 70. The instruction register 70 fetches the data (code of address register selection) in the input signal line TDI according to the clocks "iack" and "ibck" that is supplied (called to scan in).

Then, the TAP controller 4 sets the write addresses of the start code register 80, the end code register 82, and the bypass setting register 88 to the address register 84. In other words, the TAP controller 4 supplies the shift clocks "dack" and "dbck" to the data scan chain selection circuit 72. The data scan chain selection circuit 72 supplies the shift clocks "jir_ack" and "jir_bck" to the address register 84 according to an instruction code "ir" in the instruction register 70. The address register 84 fetches the input data (address data of each register) in the input signal line TDI according to the shift clocks "jir_ack" and "jir_bck" that is supplied (called to scan in).

In addition, the TAP controller 4 sets the code of the data register selection in the instruction register 70. In other words, the TAP controller 4 receives the mode instruction from the signal line TMS, and supplies the shift clocks "iack" and "ibck" to the instruction register 70. The instruction register 70 fetches the input data (code of data register selection) in the input signal line TDI according to the shift clocks "iack" and "ibck" that is supplied (called to scan in).

Then, TAP controller 4 sets the write data of the start code register 80, the end code register 82, and the bypass setting register 88 to the data register 86. In other words, the TAP controller 4 supplies the shift clocks "dack" and "dbck" to the data scan chain selection circuit 72. The data scan chain selection circuit 72 supplies the shift clocks "jdr_ack" and "jdr_bck" to the data register 86 according to an instruction code "ir" in the instruction register 70. The data register 86 fetches the input data (write data of each register) in the input signal line TDI according to the shift clocks "jdr_ack" and "jdr_bck" that is supplied (called to scan in).

The TAP controller 4 dispatches a update signal (update) to each of the start code register 80 register, the end code register 82 and the bypass setting register 88, after shift to the data register 86. The address decoder 90 decodes the register addresses which are held in the address register 84, and supplies a selection signal to each of the start code register 80, the end code register 82, and the bypass setting register 88. Therefore, the corresponding write data stored in the data register 86 are written to the start code register 80, the end code register 82 and the bypass setting register 88.

Next, the scan operation after setting to the start code register 80, the end code register 82 and the bypass setting register 88 will be described. Firstly, the scan operation when scans all FFs by the uni-chain mode will be described. The TAP controller 4 receives a mode instruction from the signal line TMS, and supplies the shift clocks "iack" and "ibck" to the instruction register 70. The instruction register 70 fetches the input data (code of uni-chain mode selection) in the input signal line TDI according to the shift clocks "iack" and "ibck" which are supplied (called to scan in).

The TAP controller 4 supplies the shift clocks "dack" and "dbck" to the data scan chain selection circuit 72. The data scan chain selection circuit 72 recognizes the uni-chain indication from the instruction code "ir" in the instruction register 70, and supplies the shift clocks "A-E_ack" and "A-E_bck" to the scan memory element group 6, and supplies the shift clocks "ack" and "bck" to the start code register 80 and the end code register 82. The data scan chain selection circuit 72 dispatches uni-chain selection signal (in this case, the signal A-E_chain_sel is off "0") to the chain control circuit 74.

Each of FF 60 in the scan memory element group 6 performs a scan operation according to the shift clocks A-E_ack and A-E_bck which were supplied, and scan in the data, and scan out the data to the output signal line TDO via the chain control circuit 74. Because the scanned data are forwarded to the output signal line TDO through the start code register 80 described above at this time, the start code is added to the beginning of the data that has been scanned. Further, since the end code in the end code register 82 is inputted to the FF 60 in a top position of the scan memory element group 6 via the chain control circuit 74, the end code is appended to the end of the data that has been scanned.

The scan data which were appended the start code and the end code is sent to the JTAG control board 30 of the host computer 3 via the exclusive cable 34 from the output signal line TDO, and is stored in the memory 32 (referring to FIG. 1).

Figure 3:
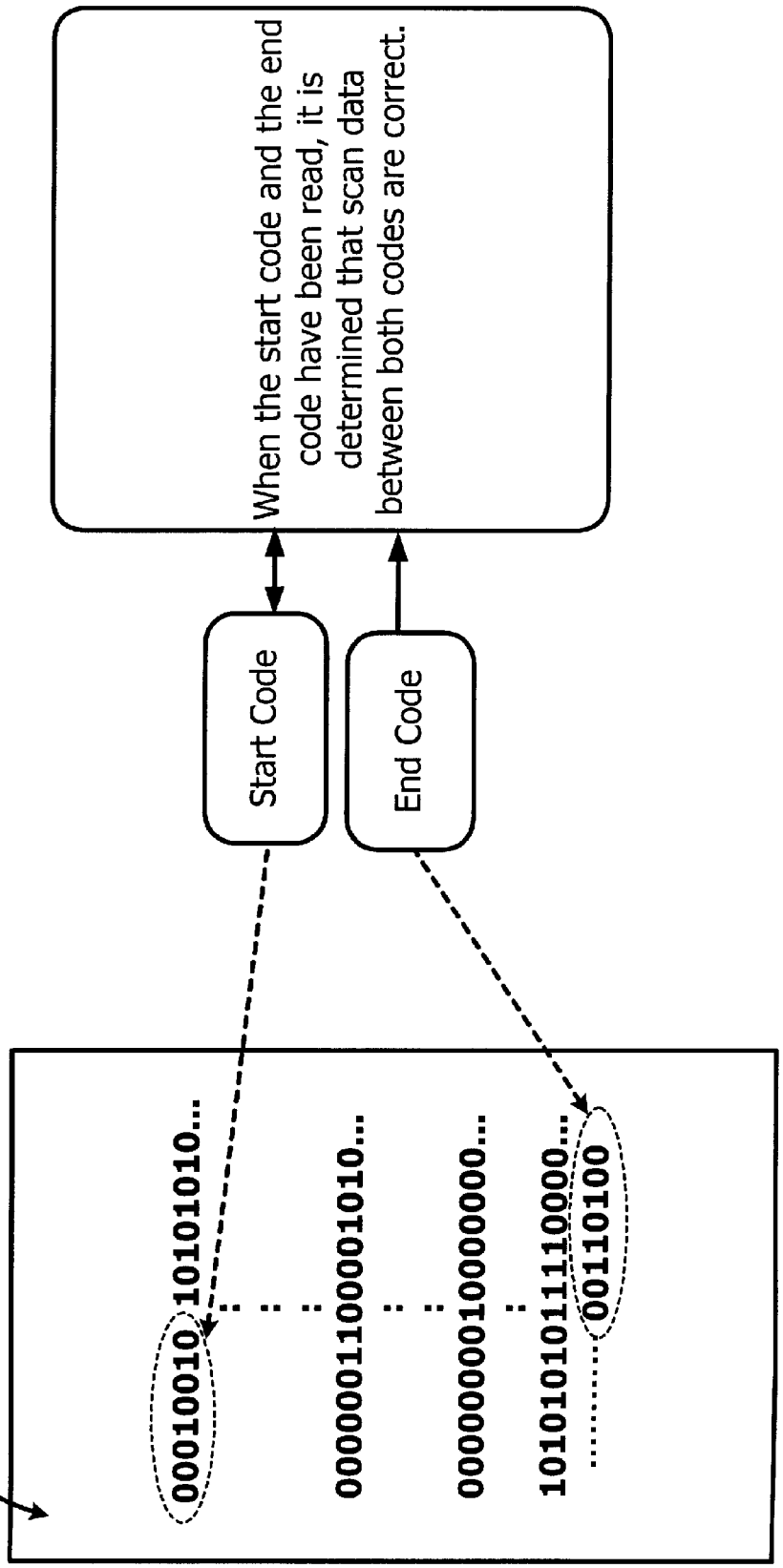
FIG. 3 is an explanatory diagram of the collected data in FIG. 2 according to an embodiment.
Figure 4:
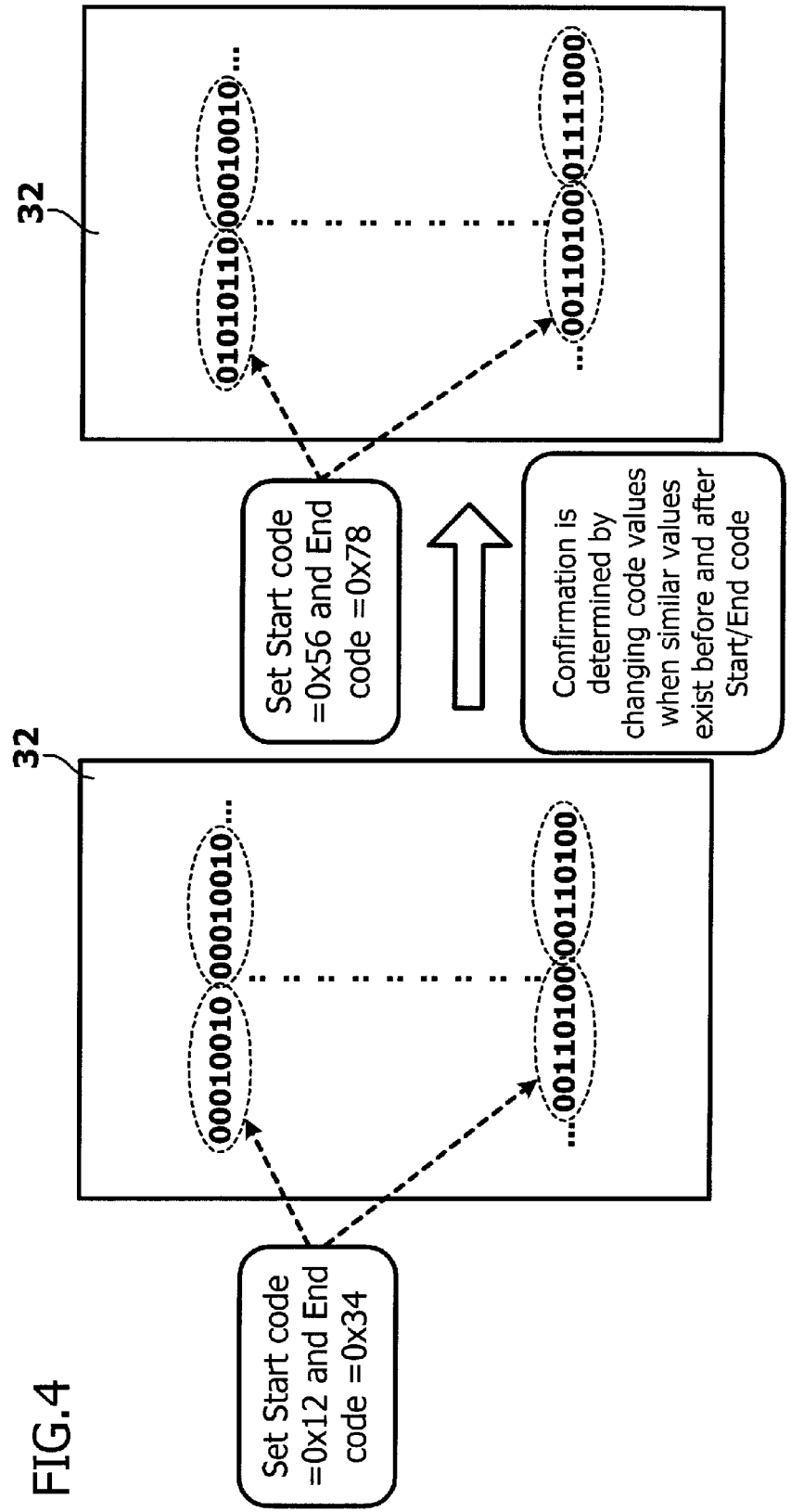
FIG. 4 is an explanatory diagram of the collection data in FIG. 2 according to another embodiment.
Figure 5:
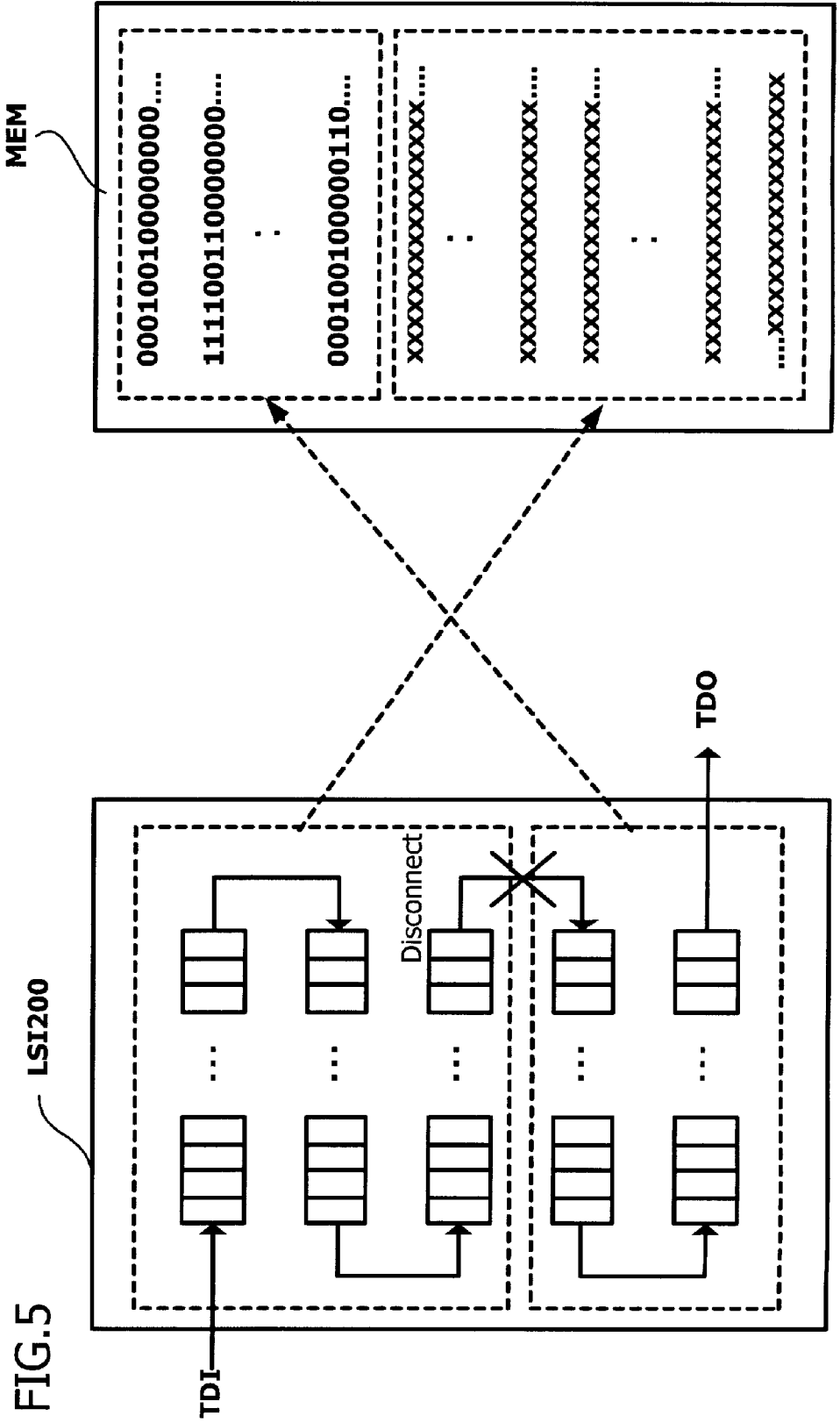
FIG. 5 is an explanatory diagram of a collection data analysis according to an embodiment.
Figure 6:
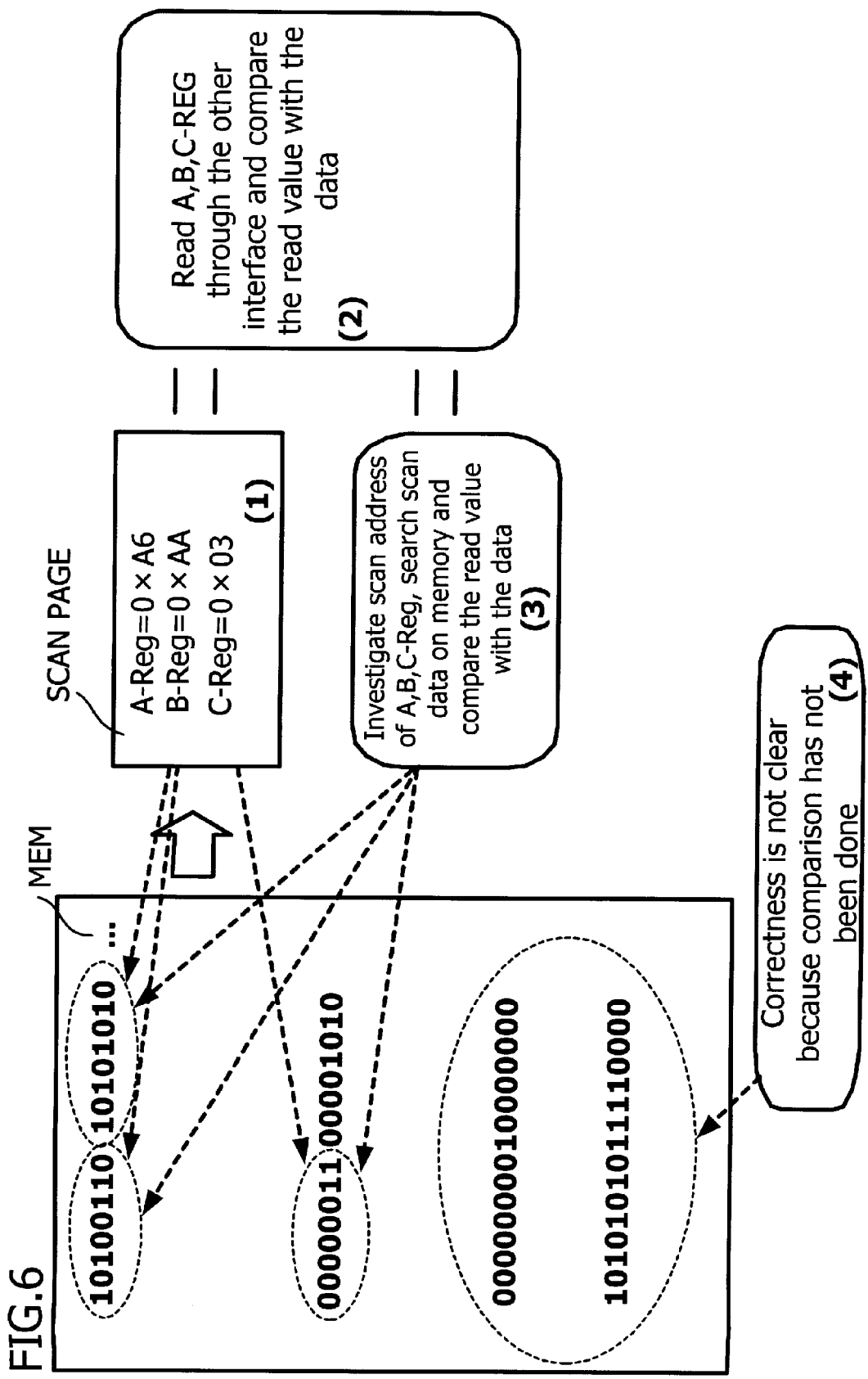
FIG. 6 is an explanatory diagram of a point analysis of collection data according to an embodiment.
Figure 7:
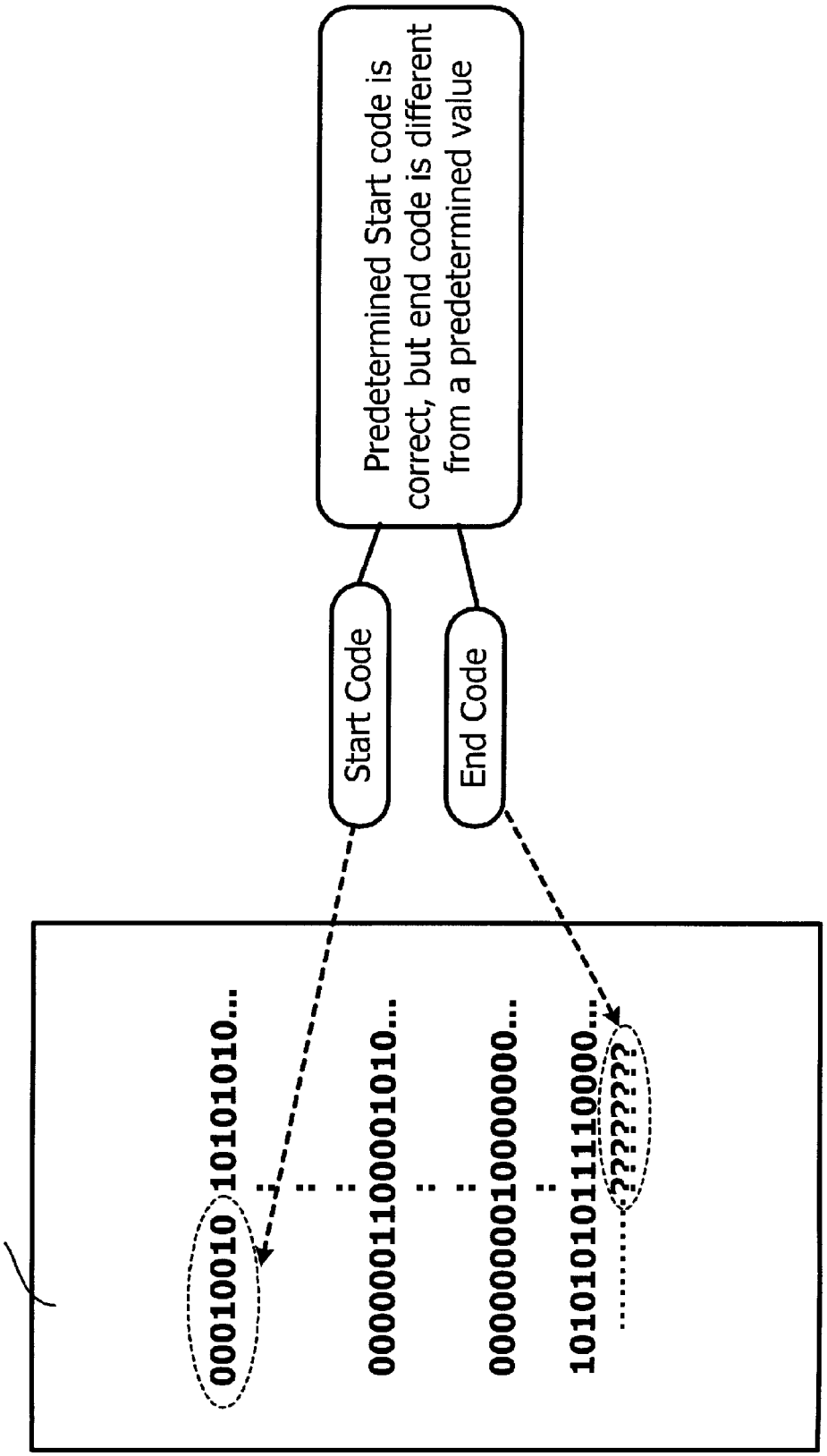
FIG. 7 is a diagram for explaining an example of the analysis of the collected data in FIG. 2.
Figure 8:
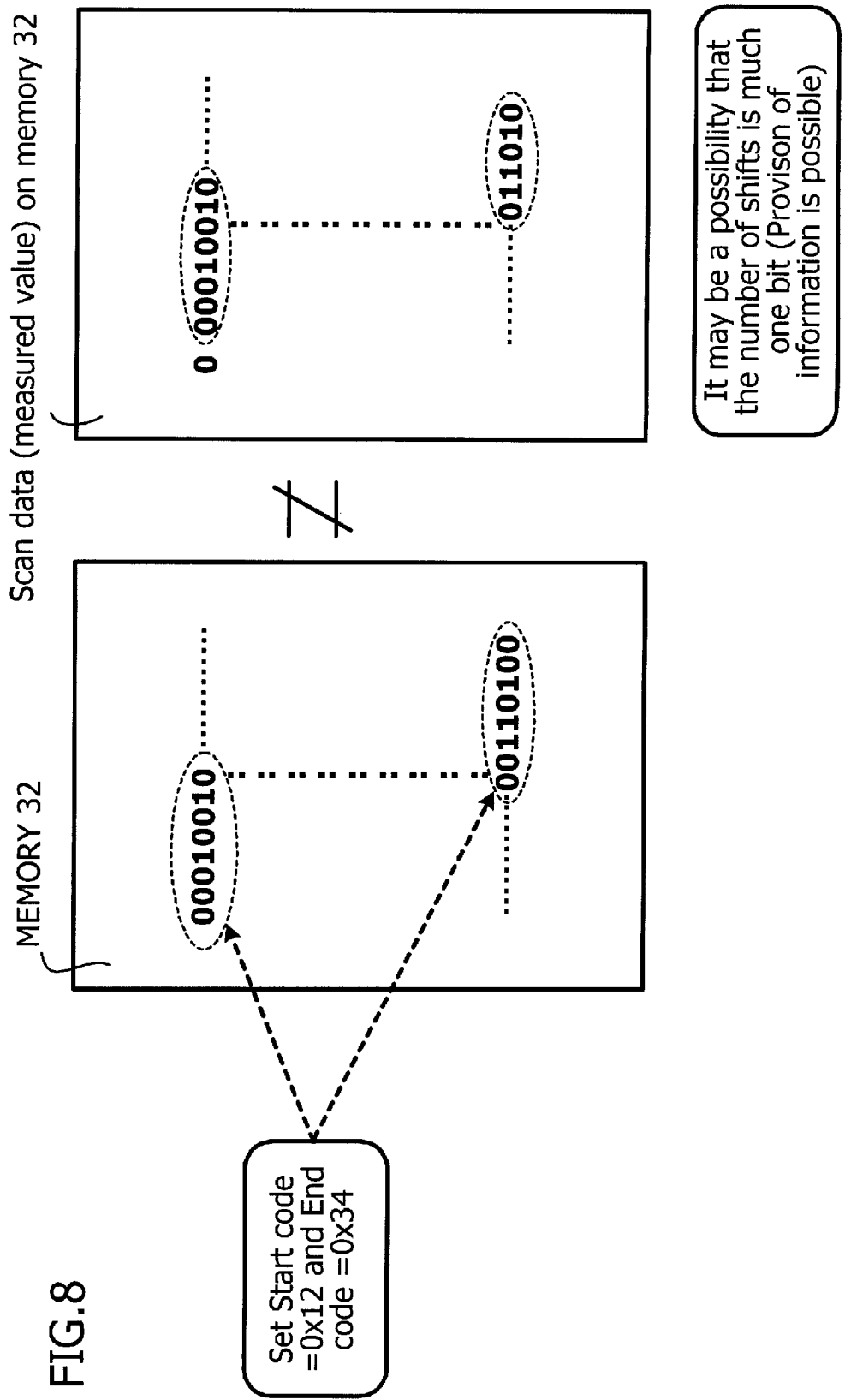
FIG. 8 is an explanatory diagram of another example of the analysis of the collected data in FIG. 2.

FIG. 3 is an explanatory diagram of the collected data in FIG. 2. FIG. 4 is an explanatory diagram of another collected data in FIG. 2. FIG. 5 is an explanatory diagram of the analysis of collected data according to an embodiment. FIG. 6 is a diagram of analysis of the collected data according to another embodiment. FIG. 7 is a diagram illustrating an example of analysis of the collected data in FIG. 2. FIG. 8 is a diagram illustrating another example of the analysis of the collected data in FIG. 2.

As illustrated by FIG. 3, the scan data in the memory 32 includes a start code at the beginning and the end code at the end. The scan data in the memory 32 are outputted. It is possible for a person in charge of the debug to determine that the scan data is correct when the scan data contains the start code and the end code that is set in advance by observing the output.

In addition, the start code and the end code can be set to any value. Since the scan data value is arbitrary, data ("00010010") and data ("00110100") which is a similar value to the start code ("00010010") and the end code ("00110100") exist before and after the start code and the end code in the scan data as depicted by FIG. 4, it is difficult to interpret the correctness. In such a case, when it is difficult to interpret after scanning one time, the start code value and the end code value are reconfigured to the start code ("00010110") and the end code ("00110100") which are different values from the similar value before and after the start code and the end code and the scan data are acquired again. Thus, regardless of the data value that holds in the scan memory element group 6, It is possible for a person in charge of the debug to determine that the scan data is correct when the scan data contains the start code and the end code that is set in advance by observing the output.

On the other hand, since the data is shifted in series in the scan of the LSI 200, when there is a faulty in one location (disconnection of the mark x in the FIG. 5), the scan data after the fault location data becomes to invalid as depicted by FIG. 5. That is, even if outputting the contents of the memory MEM which contains the data collected, the data after a faulty location becomes to invalid data as indicated by the mark "X" in FIG. 5. For this reason, it is insufficient for determination of the correctness to confirm only point place in all data (for example, several hundreds of thousand bits). Also, it is inefficient to check a lot of the points, because it may take several days for research.

For example, FIG. 6 illustrates an example of a determination of the correctness by observing the point location. A portion of the scan data ("101 . . . ") stored in the memory MEM is developed to a scan page (as depicted by (1) in FIG. 6). That is, analysis tools (program) runs and develops data (8 bit in FIG. 6) of the point location in the scan data to the scan page per register unit (A-REG, B-REG, C-REG). Then, the data of the FF in the LSI are read from the other interfaces per register unit (A-REG, B-REG, C-REG). And the read value are compared with the values on the scan page scan (as depicted by (2) in FIG. 6).

In addition, when directly used the scan data ("01 . . . ") stored in the memory MEM, by examining the scan address of the comparison points such as registers, the scan data is found from the memory MEM (as depicted by (3) in FIG. 6). Then, the data of the FF in the LSI are read from the other interfaces, and the read value are compared with the found value (as depicted by (2) in FIG. 6).

In this way, since the collected data by scanning are large (several hundreds of thousand bits), it is difficult to check all the FF by the manner described above. Therefore, the comparing check points remain (as depicted by (4) in FIG. 6).

The expected values (setting values) of the start code and the end code can also be used as not only the determination of the correctness, but also information seems to be illegal.

As indicated by FIG. 7, there is a case that the start code in the scan data of the memory 32 match with the expected value (set value), but the end code mismatch with the expected value (set value). As described in the configuration of FIG. 2, because the start code does not pass through the scan memory element group 6, it is low possibility that the start code is likely to be mismatch. On the other hand, because the end code passes through the scan memory element group 6, it is possible to determine there may be a problem with the scan chain (hard) somewhere in the scan memory element group 6 when the end code mismatches.

Further, as indicated by FIG. 8, when the start code ("00001001") and the end code ("011010") which was measured do not match the expected value ("0001010"=0x12) of the start code and the expected value ("00110100") of the end code, but are similar value to the expected value, it is possible to determine there may be a problem with setting number of shift in the scan. In FIG. 8, there is a possibility that the number of shifts is much one bit.

In other words, it is possible to analyze that the number of shifts set by the JTAG program is different from the number of shifts required for the target LSI. When the scan data is incorrect, it is possible to investigate a problem for a program that controls the JTAG, or a problem of the scan chain (hard) in the LSI. In the embodiment, it is possible to provide criteria of the determination in the investigation.

(Method of Identifying a Filed Location)

Figure 9:
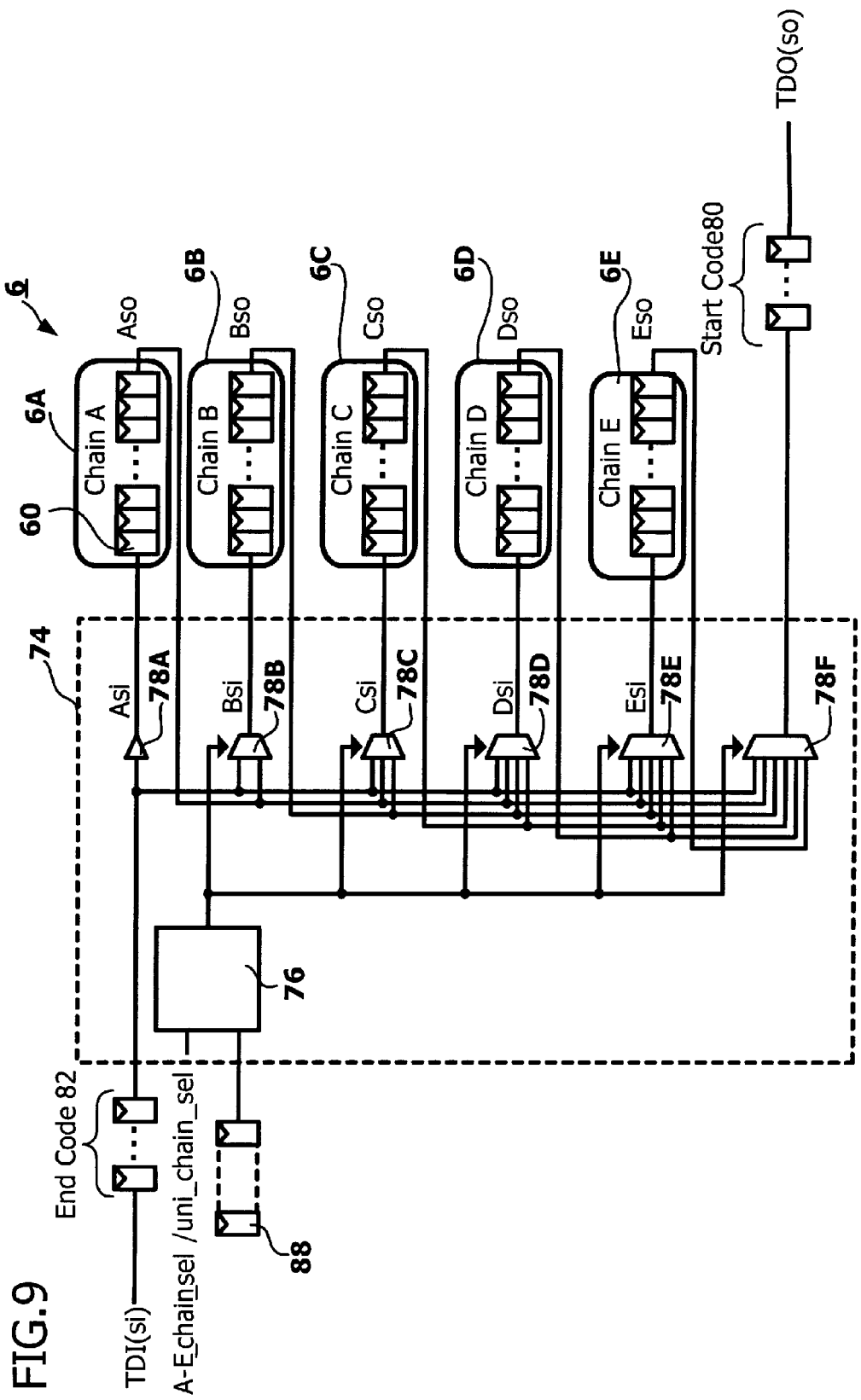
FIG. 9 is a block diagram of a chain control circuit and a scan memory elements group described in FIG. 2.
Figure 12:
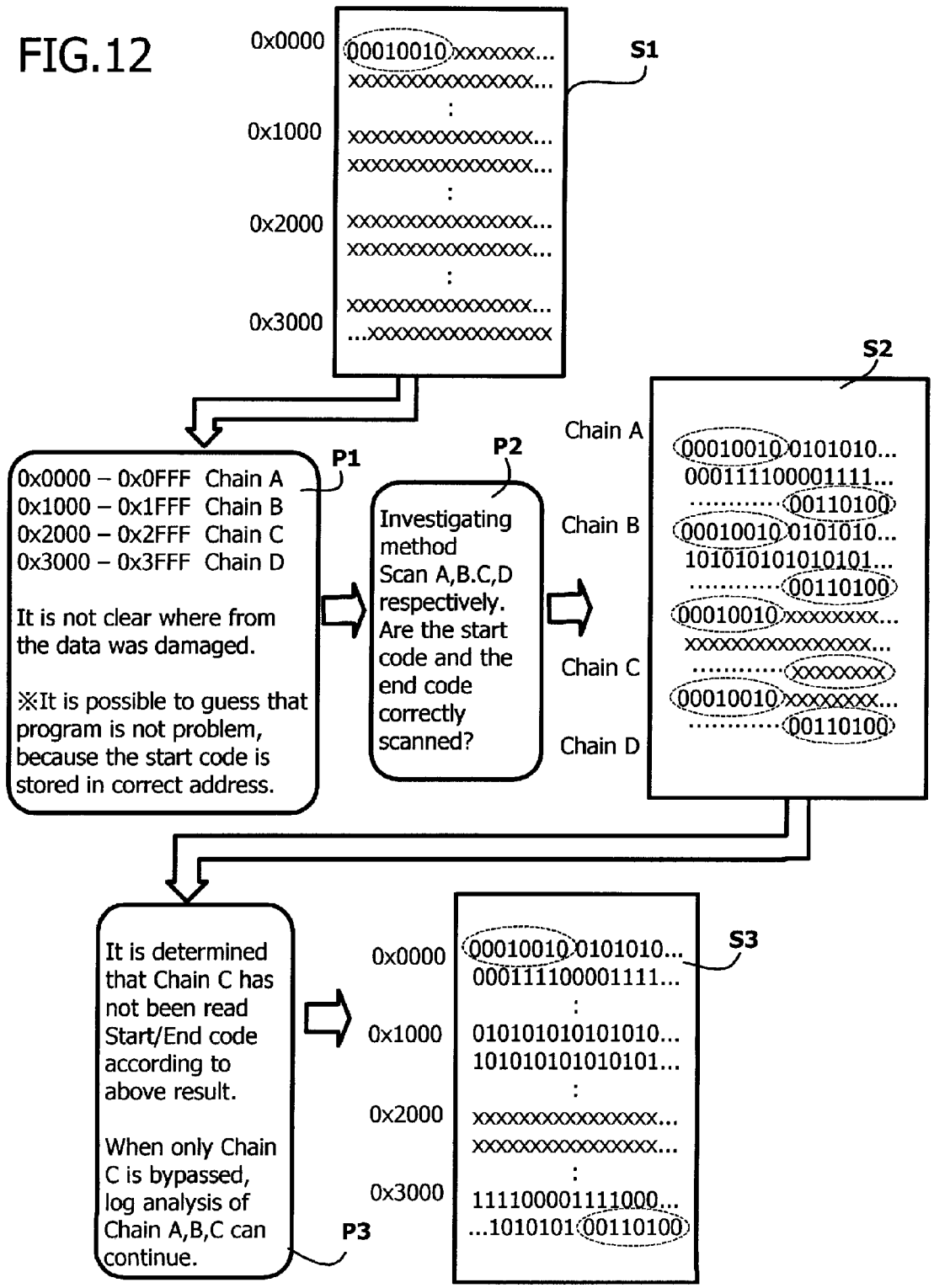
FIG. 12 is an explanatory diagram of how to identify a failed location by the configuration in FIG. 9.

Next, the collection of scan data using the bypass setting register 88 and the user chain in FIG. 2 will be explained. FIG. 9 is a block diagram of the chain control circuit 74 and the scan memory element group 6 described in FIG. 2. FIG. 10 is an explanatory diagram of the selection logic of the selection circuit in FIG. 9. FIG. 11 is an explanatory diagram of the selection criteria in the selection circuit in FIG. 10. FIG. 12 is an explanatory diagram of a method for specifying fault location according to the configuration of FIG. 9.

In FIG. 9, same elements as those described in FIG. 2 are indicated by the same symbols. The scan memory element group 6 has five blocks 6A, 6B, 6C, 6D and 6E. Each of blocks 6A, 6B, 6C, 6D and 6E has a plurality of FF 60 which is connected in a chain (in series). The blocks 6A, 6B, 6C, 6D and 6E receive input data "Asi", "Bsi", "Csi", "Dsi" and "Esi" from the chain control circuit 74, and output data "Aso", "Bso", "Cso", "Dso" and "Eso" to the chain control circuit 74.

The chain control circuit 74 receives an end code in the end code register 82. In addition, the chain control circuit 74 receives bypass data "A-E_BYP" in the bypass setting register 88 and chain selection signal "A-E_chain_sel" from the data scan chain selection circuit 72 as chain selection criteria.

The chain control circuit 74 includes single drive circuit 78A, five chain selection circuit 78B, 78C, 78D, 78E and 78F and a selection signal creation circuit 76. The driver circuit 78A and four chain selection circuit 78B, 78C, 78D and 78E output the input data "Asi", "Bsi", "Csi", "Dsi", and "Esi" to blocks 6A, 6B, 6C, 6D and 6E, respectively.

The chain selection circuit 78F outputs the scan output so to the output signal line TDO through the start code register (shift register) 86. The selection signal creation circuit 76 creates the selection signal of output of the chain selection circuit 78A, 78B, 78C, 78D, 78E and 78F by the selection logic as indicated by FIG. 10 and FIG. 11 from the bypass data "A-E_BYP" in the bypass setting register 88 and the chain selection signal "A-E_chain_sel" from the data scan chain selection circuit 72.

The chain selection signal "A-E_chain_sel" has a selection bit of each block A~E to select the output of each block A~E. In the selection bit, bit value "1" (ON) indicates the selection, and the bit value "0" (OFF) indicates the non-selection. The bypass selection signal "A-E_BYP" has a selection bit of each block A~E to bypass each block A~E. In the selection bit, bit value "1" (ON) indicates the bypass, and the bit value "0" (OFF) indicates the non-bypass.

The driver circuit 78A receives the input signal "si" from the input signal line TDI via the end code shift register 82 and outputs the input data "Asi" to the block 6A. The first chain selection circuit 78B receives the input data "si" and the output data "Aso" of the block 6A, selects one of the input data "si" and the output data "Aso" according to the selection signal and outputs the input data "Bsi" to the block 6B.

The second chain selection circuit 78C receives the input data "si" and the output data "Bso" of the block 6B, selects one of the input data "si" and the output data "Bso" according to the selection signal and outputs the input data "Csi" to the block 6C. The third chain selection circuit 78D receives the input data "si", the output data "Aso" of the block 6A, the output data "Bso" of the block 6B, and the output data "Cso" of the block 6C, selects one of the input data "si", the output data "Aso", the output data "Bso" and the output data "Cso" according to the selection signal and outputs the input data "Dsi" to the block 6D.

The fourth chain selection circuit 78E receives the input data "si", the output data "Aso" of the block 6A, the output data "Bso" of the block 6B, the output data "Cso" of the block 6C and the output data "Dso" of the block 6D, selects one of the input data "si", the output data "Aso", the output data "Bso", the output data "Cso" and the output data "Dso" according to the selection signal and outputs the input data "Esi" to the block 6E. The fifth chain selection circuit 78F receives the input data "si", the output data "Aso" of the block 6A, the output data "Bso" of the block 6B, the output data "Cso" of the block 6C, the output data "Dso" of the block 6D and the output data "Eso" of the block 6E, selects one of the input data "si", the output data "Aso", the output data "Bso", the output data "Cso", the output data "Dso" and the output data "Eso" according to the selection signal and outputs the scan data "so" to the start code register 80D.

In FIG. 10, the output "Asi", "Bsi", "Csi", "Dsi", "Esi" and "so" of the driver circuit 78A and the chain selection circuits 78B~78F are represented on a vertical axis, and the input "si", "Aso", "Bso", "Cso", "Dso" and "Eso" of the driver circuit 78A and the chain selection circuits 78B~78F are represented on a horizontal axis. Above described connection between the driver circuit 78A and the chain selection circuits 78B~78F indicate connection to select the input on the horizontal axis which is marked with a circle in the output line of the vertical axis in FIG. 10. The selection signal creation circuit 76 creates the selection signals of the driver circuit 78A and the chain selection circuit 78B~78F according to the logic in FIG. 10.

Detail will be described in FIG. 11. Also in FIG. 11, the output "Asi", "Bsi", "Csi", "Dsi", "Esi" and "so" of the driver circuit 78A and the chain selection circuits 78B~78F are represented on a vertical axis, and the input "si", "Aso", "Bso", "Cso", "Dso" and "Eso" of the driver circuit 78A and the chain selection circuits 78B~78F are represented on a horizontal axis. The conditions of the selection signal of the selection signal creation circuit 76 are indicated in intersection mass of the horizontal axis and the vertical axis.

The selection signal creation condition N in FIG. 11 refers to a Normal of which all bits of the chain selection signal "A_E_chain_sel" are in off status, all bits of the bypass data "A-E_BYP" are in the off state and the uni chain select signal "uni_chain_sel" is in ON. The conditions of selection signal creation A, B, C, D, E mean that the bits of the block A~E of the chain selection signal "A_E_chain_sel" are ON. The selection signal creation conditions a, b, c, d, e mean that the bits of the block A~E of the bypass data "A_E_BYP" are ON. And the uni chain is specified when uni chain selection signal "uni_chain_sel" selection is ON. In addition, the sign "+" in FIG. 11 indicates OR condition.

The selection signal creation circuit 76 receives the bypass data "A-E_BYP" and the chain selection signal "A-E_chain_sel" and creates a selection signal of the chain selection circuit 78B~78F as follows, according to FIG. 11.

(1) When the mass in FIG. 11 indicates only "N", the chain selection circuits 78B~78E selects the output "Aso", "Bso", "Cso", and "Dso" of the preceding stage, and the chain selection circuit 78F creates a selection signal for selecting the input "sr.

(2) When the mass in FIG. 11 indicates "B+a", "C+a+b", "D+a+b+c", "E+a+b+c+d", each chain selection circuit 78B~78E creates a selection signal for selecting the input "si". When the mass in FIG. 11 indicates "A+b+c+d+e", "B+c+d+e", "C+d+e", "D+d+e", "N+E", the chain selection circuit 78F creates a selection signal for selecting the output "Aso", "Bso", "Cso", "Dso", and "Eso" in correspondence to each case of the mass indication. Thus, the choice of the user chain is performed.

(3) Next, a selection which only uses the bypass data within a black boarder in FIG. 11 will be explained. When the mass in FIG. 11 indicates "b", "b+c", "b+c+d", each the chain selection circuits 78C~78E create a selection signal for selecting the output "Aso", respectively. When the mass in FIG. 11 indicates "c" and "c+d", the chain selection circuit 78D~78E creates a selection signal for selecting the output "Bso" corresponding to each case of the mass indication. When the mass in FIG. 11 indicates "d", the chain selection circuit creates a selection signal for selecting the output "Cso".

By the combination of these, the chain control circuit 74 selects a configuration one of the uni chain, the user chain which is specified, and the bypass chain. For example, when the mass in FIG. 11 indicates "N" (Normal), the chain selection circuit 78B~78F forms the uni chain to select the output "Aso", "Bso", "Cso", "Dso", and "Eso" of the block A, B, C, D, E of the former stage.

Further, when the mass in FIG. 11 indicates "B+a" and "B+c+d+e" (in a case of the selection instruction of the block B or the bypass instruction of the block A, C, D and E), the chain selection circuit 78B selects the input "si", and the chain selection circuit 78F selects the output "Bso" of the block B. In other words, the user chain of only the block 6B is formed.

Similarly, when the mass in FIG. 11 indicates "C+a+b" and "C+d+e" (in a case of the selection instruction of the block C or the bypass instruction of the block A, B, D and E), the user chain of only the block 6C is formed. When the mass in FIG. 11 indicates "D+a+b+c" and "D+e" (in a case of the selection instruction of the block D or the bypass instruction of the block A, B, C and E), the user chain of only the block 6D is formed. When the mass in FIG. 11 indicates "E+a+b+c+d" and "N+E" (in a case of the selection instruction of the block E or the bypass instruction of the block A, B, C and D), the user chain of only the block 6E is formed.

Next, the operation of the bypass which is surrounded by a black border in FIG. 11 will be explained. When the mass in FIG. 11 indicates "b" (to bypass the block B), only the block B is bypassed. When the mass in FIG. 11 indicates "c" (to bypass the block C), only the block C is bypassed. When the mass in FIG. 11 indicates "d" (to bypass the block D), only the block D is bypassed.

When the mass in FIG. 11 indicates "b+c" (to bypass the blocks B and C), the blocks B and C are bypassed. When the mass in FIG. 11 indicates "c+d" (to bypass the blocks C and D), the blocks C and D are bypassed. When the mass in FIG. 11 indicates "b+c+d" (to bypass the blocks B, C and D), the blocks B, C and D are bypassed.

In this way, it is possible to form the uni-chain of the blocks 6A~6E, or single user chain or a chain which bypass specific block in the chain memory element group 6.

A method of specifying the fault location will be explained by FIG. 12. Here, the example that the number of blocks is four will be described. All user chain (small chain) 6A~6D are connected to from a single chain. And the single chain is scanned and the scan data (measured values) is log-collected into the memory (as indicated by S1 in FIG. 12). In log-collection results, the memory addresses of the scan data in the chain A (corresponding to the block D in FIG. 9), the chain B (corresponding to the block C in FIG. 9), the chain C (corresponding to the block B in FIG. 9) and the chain D (corresponding to the block A in FIG. 9) are, respectively, "0x0000-0x0FFF", "0x1000-0x1FFF", "0x000-0x0FFF", and "0x1000-0x1FFF". In addition, the start code "00010010" is the correct one.

Here, when the end code is not found at the end of the scan data, it is unclear from where the data is corrupted. In addition, since the start code is correct, it is guessed that there is not a problem of the program (as indicated by P1 in FIG. 12).

Therefore, each chain in the scan memory element group 6 is investigated. That is, each chain A, B, C, and D is scanned separately. That is, as described above, the TAP controller 4 is specified the user chain and then the data scan chain selection circuit 72 dispatches the chain selection signal "A-E_chain_sel". Along with this operation, the data scan chain selection circuit 72 supplies the shift clocks "A-E_ack" and "A-E_bck" to the scan memory element group 6 and the shift clocks "ack" and "bck" to the start code register 80 and end code register 82 (as indicated by P2 in FIG. 12).

As a result, the scan is performed on a user chain basis, and the scan data is collected which was added the start code and the end code on each user chain and is stored in the memory (as indicated by S2 in FIG. 12). In S2 in FIG. 12, the data that is surrounded by a dotted line are the start code and the end code.

By using the collected data, it is checked whether or not the start code and the end code which are the expected value appear in the first and last portion of this scan data of each chain A, B, C and D (as depicted by P3 in FIG. 12). In the example of FIG. 12, it is found that the end code did not appear at the end of the chain C. That is, the faulty chain id identified. In this case, the faulty chain C is bypassed and then the chains A, B, and D are connected, and the log analysis is performed for chains.

That is, the chain bypass register 88 is written the bypass data of the user chain as depicted by FIG. 11, and the data scan chain selection circuit 72 supplies the shift clocks "A-E_ack" and "A-E_bck" to the scan memory element group 6 and the shift clocks "ack" and "bck" to the start code register 80 and end code register 82. Thereby, the scan data of the uni-chain of the chains A, B, D except the bypassed chain C is collected in the memory (as indicated by S3 in FIG. 12). In the example of S3 in FIG. 12, it is found that the start code appears at the top of the scan code of the uni-chain which connects the chains A, B, D and the end code appears at the end of the scan code (as depicted by a part surrounded in a dotted line in S3 of FIG. 12). Accordingly it is determined that the chains A, B, D are normal.

In the embodiment, the bypass register is provided a bit that can be controlled per user chain basis, and the scan is performed in the uni-chain mode scans after bypass setting. Thereby, by bypassing the problem chain by the circuit which forms the uni-chain, it is possible to allow scanning.

In this way, it is possible to instantly determine correctness of scan data. Therefore, it is possible to improve a debug efficiency. In addition, since all of the collected data can be confirmed, debug quality is improved. Furthermore, since it is possible to provide information at the time of the survey, debug efficiency is improved.

(Information Processing System)

Figure 13:
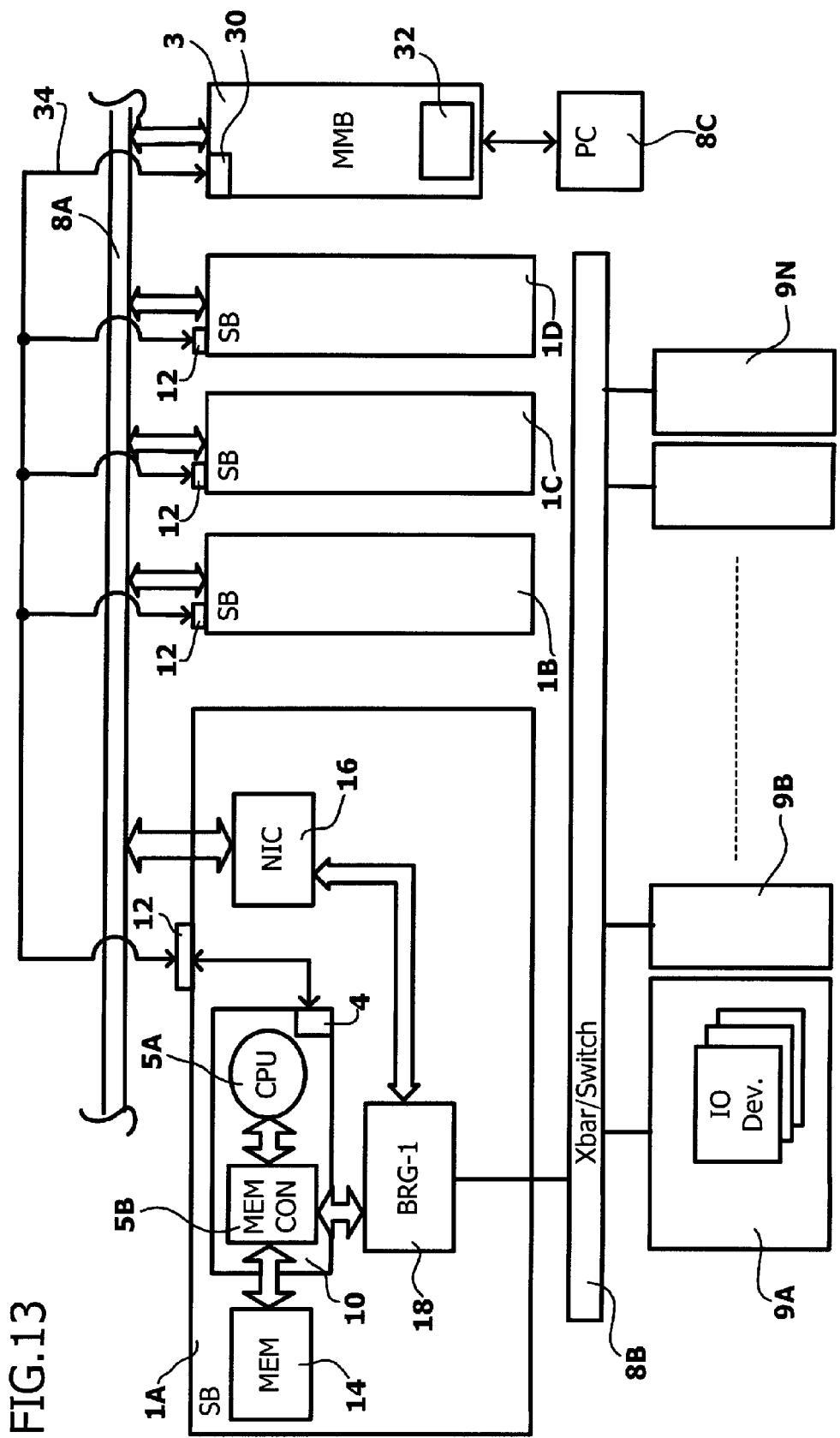
FIG. 13 is a block diagram of an information processing apparatus applied the debugging system in FIG. 1 and FIG. 2 according to an embodiment.
Figure 14:
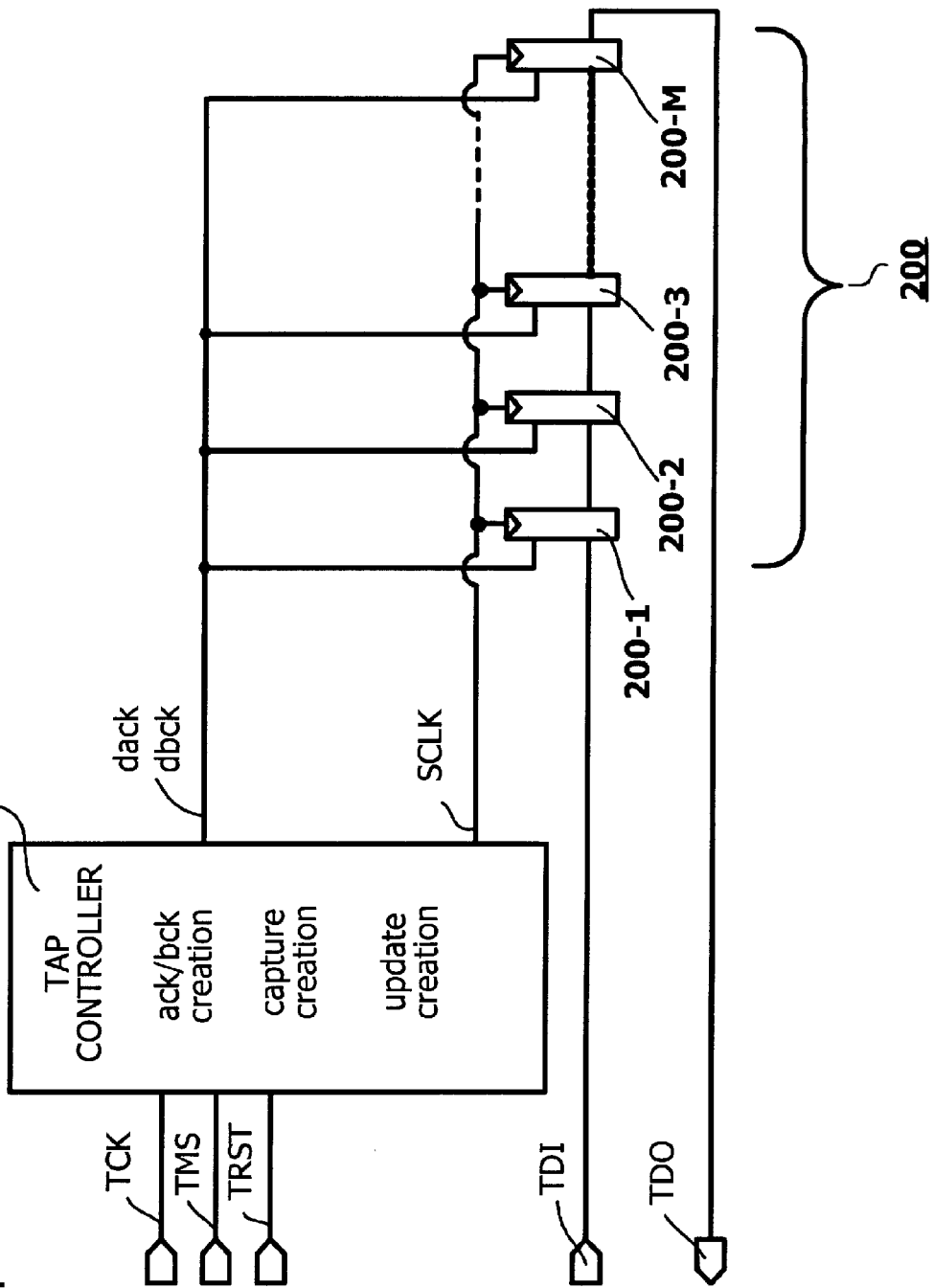
FIG. 14 is an explanatory diagram of a conventional scan test.
Figure 15:
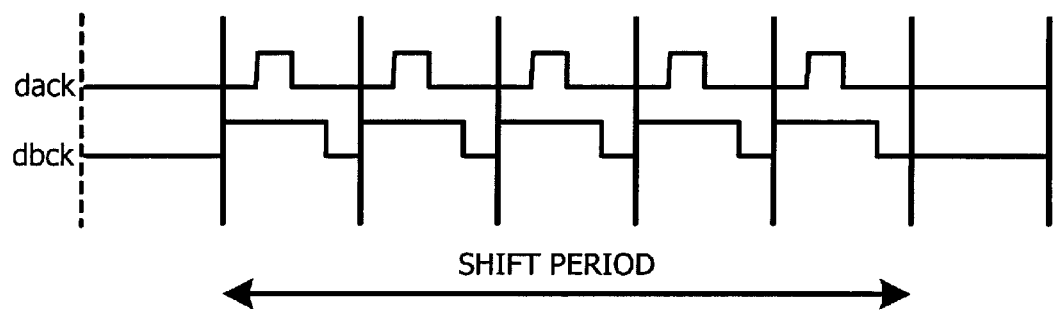
FIG. 15 is an explanatory diagram of shift clock of the conventional scan test.

FIG. 13 is a block diagram of the information processing system applied the debugging system in FIG. 1 and FIG. 2 according to an embodiment. The information processing system in FIG. 13 illustrates a server system. In FIG. 13, same elements as those described in FIG. 1 and FIG. 2 are indicated by the same symbols. As depicted by FIG. 13, the server system includes a plurality of system boards 1A~1D (described as SB in FIG. 13) as a processing unit, a management board 3 (described as MMB in FIG. 13) as a system controller, a crossbar switch (or switch) 8B, a plurality of input and output units (called as IOU) 9A, 9B, ~9N, an internal bus 8A, and a terminal device 8B.

Each system boards 1A~1D corresponds to the board 1 in FIG. 1, and the management board 3 corresponds to the host computer 3 in FIG. 1. Each system board includes a CPU (Central Processing Unit) 5A as an arithmetic processing unit, a memory controller 5B, a memory 14 as a main storage device, a bridge circuit 18, and a network interface circuit (described as NIC: a Network Interface Card) 16 on a circuit board.

The NIC 16 in each system boards 8A connects the management board 3 through the internal bus 8A such as a LAN (Local Area Network). The management board 3 monitors the status, controls start and stop of each system board 1A~1D through the internal bus 8A. Moreover, each system board 1A 1D connects the IOU 9A~9N by the crossbar switch (or switch) 8B.

The IOU 9A~9N is equipped with an IO device, such as a LAN device and a storage controller. By appropriately setting the crossbar switch 8B, it is possible to logically divide to a plurality of systems. Therefore, it is possible to freely allocate the resources of the system board and the resources of the IOU depending on the size of the system which is running.

In each of the system boards 1A~1D, the CPU 5A, the memory controller 5B and the TAP controller 4 as described in FIG. 1 and FIG. 2, or the like are provided on a single LSI 10. Further, although not illustrated in FIG. 13, the instruction register 70, the data scan chain selection circuit 72, the chain control circuit 74, the data setting circuit 76 and the scan memory element group 6 described in FIG. 2 are provided on the LSI 10.

The CPU 5A connects to the memory 14 via the memory controller 5B. The memory controller 5B and the NIC 16 are connected to the bridge circuit 18. The CPU 5A performs processing operation to run a desired application program under an operation of the OS. In addition, the CPU5A communicates commands and data with the IOU 9A~9N through the bridge circuit 18 via the crossbar switch 8B.

The bridge circuit 18 connects to the NIC 16 and the crossbar switch 8B. In other words, the bridge circuit 18 performs a bridge function which connects the CPU5A, the crossbar switch 8B and the NIC 16.

The connector 12 as described in FIG. 1 is provided in each system board 1A~1D. The connector 12 connects to the TAP controller 4 in the LSI 10. The JTAG controller 30 is provided to the management board 3. The JTAG controller 30 in the management board 3 connects to the connectors 12 in each system boards 1A~1D via the dedicated cable 34 described in FIG. 2. The terminal device 8C is constituted of a personal computer (described as PC), for example. The terminal device 8C connects to the MMB5, and instructs various settings by an item selection on a screen of the personal computer, and displays the acquired data in the MMB 5.

Therefore, the MMB 3 connects to the connector 12 in each system boards 1A~1D through the JTAG controller 30 and the dedicated cable 34. The connector 12 connects to the TAP controller 4 in the LSI 10. In other words, the debugging system described in FIG. 1 and FIG. 2 is provided in the server system. Therefore, in a state that the LSI 10 is mounted on the board 1A~1D, it is possible to perform a function test of the LSI 10 as described in FIG. 1 to FIG. 12.

Therefore, a person in charge of the debug operates the terminal device 8C, collects the status (scan data) of the FF in the LSI 10 from the JTAG controller 30, and stores the scan data in the memory 32. The person in charge of the debug displays or prints the collected data in the memory 32 to the screen of the terminal device 8C or by the printer associated with the terminal device 8C. The person in charge of the debug observes this output, and determines whether or not the scan was successful and whether or not the collected data is correct.

In the early stage of LSI functional testing, when there is an error in the collected data, it is necessary to judge that the error caused by which of the error of the JTAG program or the error in the scan chain. In the embodiment, it is easy to determine which of JTAG programming error or the error of the scan chain. Also, it is possible to easily determine the failure location in the scan chain.

In addition, after the shipment of the server system, when there is any abnormality, a functional test of the LSI can be performed, thereby it contributes to the discovery of the cause of the failure. In particular, since hundreds of thousands of the scan data are collected by scanning test due to the increasing complexity of the LSI, the easy determination of the correctness with little effort contributes to the efficiency of the debug works.

Other Embodiments

In the embodiment described above, though the flip-flop has been described as an example of scan memory element, the other memory element that can be shifted may be applied. Also the scan test method has been described by way of the standard JTAG scan test method, but the other scanning method using a dedicated path may be applied. Furthermore, although the debug system has been described in the example provided bypass function, the debug system which has not bypass function may be applied.

The foregoing has described the embodiments of the present invention, but within the scope of the spirit of the present invention, the present invention is able to various modifications, and it is not intended to exclude them from the scope of the present invention.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A semiconductor integrated circuit device comprising:
   a scan memory element group that a plurality of scan memory elements are connected in series;
   an end code register that is provided between an input terminal and an input side of the scan memory element group and holds an end code;
   a start code register that is provided between an output terminal and an output side of the scan memory element group and holds a start code; and
   a scan control circuit that controls shift operations of the scan memory element group, the end code register and the start code register and outputs scan data to the output terminal.

2. The semiconductor integrated circuit device according to claim 1, wherein the scan control circuit writes the start code which is inputted into the start code register and writes the end code which is inputted into the end code register.

3. The semiconductor integrated circuit device according to claim 1,
   wherein the scan memory element group comprises a plurality of blocks, each of which the plurality of scan memory elements are connected in series, and
   wherein the scan control circuit controls that the plurality of blocks are connected in series in response to an instruction of a single chain, and controls that a designated block among the plurality of blocks is connected to the end code register and the start code register in accordance with an instruction of an individual chain.

4. The semiconductor integrated circuit device according to claim 3,
   wherein the device further comprises a bypass register that holds bypass data to designate the block to be bypassed, and
   wherein the scan control circuit forms a single chain that connects the plurality of blocks except the block that is specified by the bypass register, in series.

5. The semiconductor integrated circuit device according to claim 4, wherein the scan control circuit writes the bypass data which is inputted into the bypass register.

6. The semiconductor integrated circuit device according to claim 1,
   wherein the device further comprises a functional circuit that performs a predetermined function, and
   wherein the scan memory element group hold status of the functional circuit.

7. The semiconductor integrated circuit device according to claim 3, wherein the scan control circuit comprises:
   a chain control circuit that controls that the plurality of blocks are connected in series in response to the instruction of the single chain, and controls that the designated block among the plurality of blocks is connected to the end code register and the start code register in accordance with the instruction of the individual chain; and a data scan selection circuit that analyzes an instruction code from the input terminal, provides the instruction of chain and provides a shift clock to the scan memory element group, the end code register and the start code register.

8. The semiconductor integrated circuit device according to claim 7, wherein the device further comprises a bypass register that holds bypass data to designate the block to be bypassed, and wherein the scan control circuit forms a single chain that connects the plurality of blocks except the block that is specified by the bypass register, in series.

9. A method of controlling of a semiconductor integrated circuit device, the method comprising:

connecting an end code register, which holds an end code, to an input side of a scan memory element group in which a plurality of scan memory elements are connected in series;

connecting a start code register, which holds a start code, to an output side of the scan memory element group;

controlling a shift operation of the scan memory element group, the end code register, and the start code register; and outputting scan data to the output terminal to collect data of the scan memory element group.

10. The method of controlling a semiconductor integrated circuit device according to claim 9, the method further comprises:

writing the start code from the input terminal into the start code register; and writing the end code from the input terminal into the end code register.

11. The method of controlling a semiconductor integrated circuit device according to claim 9, the method further comprises:

connecting a plurality of blocks, each comprising a plurality of scan memory elements which are connected in series in the scan memory element group, in response to an instruction of a single chain; and connecting a designated block among the plurality of blocks to the end code register and the start code register in accordance with an instruction of an individual chain.

12. The method of a semiconductor integrated circuit device according to claim 11, wherein the method further comprises forming a single chain that connects the plurality of blocks except the block that is specified by a bypass register that holds bypass data to specify the block to be bypassed, in series.

13. The method of a semiconductor integrated circuit device according to claim 11, wherein the method further comprises writing the bypass data from the input terminal into the bypass register.

14. The method of a semiconductor integrated circuit device according to claim 11, wherein the scan memory element group hold status of the functional circuit that performs a predetermined function.

15. The method of a semiconductor integrated circuit device according to claim 12, wherein the method further comprises:

analyzing an instruction code from the input terminal and providing the instruction of chain;

providing a shift clock to the scan memory element group, the end code register and the start code register;

connecting the plurality of blocks in series in response to the instruction of the single chain; and connecting the designated block among the plurality of blocks to the end code register and the start code register in accordance with the instruction of the individual chain.

16. An information processing system comprising:

a processing device having a semiconductor integrated circuit that performs information processing; and a system control device that monitors the processing device, wherein the semiconductor integrated circuit comprises:

a functional circuit that performs the information processing;

a scan memory element group that a plurality of scan memory elements are connected in series;

an end code register that is provided between an input terminal connected to the system control device and an input side of the scan memory element group and holds an end code;

a start code register that is provided between an output terminal connected to the system control device and an output side of the scan memory element group and holds a start code; and a scan control circuit that controls shift operations of the scan memory element group, the end code register and the start code register and outputs scan data to the output terminal.

17. The information processing system according to claim 16, wherein the scan control circuit writes the start code which is inputted into the start code register and writes the end code which is inputted into the end code register.

18. The information processing system according to claim 16, wherein the scan memory element group comprises a plurality of blocks, each of which the plurality of scan memory elements are connected in series, and wherein the scan control circuit controls that the plurality of blocks are connected in series in response to an instruction of a single chain, and controls that a designated block among the plurality of blocks is connected to the end code register and the start code register in accordance with an instruction of an individual chain.

19. The information processing system according to claim 18, wherein the semiconductor integrated circuit device further comprises a bypass register that holds bypass data to designate the block to be bypassed, and wherein the scan control circuit forms a single chain that connects the plurality of blocks except the block that is specified by the bypass register, in series.

20. The information processing system according to claim 19, wherein the scan control circuit writes the bypass data which is inputted into the bypass register.

* * * * *